United States Patent
Lavoie et al.

(10) Patent No.: US 12,110,586 B2
(45) Date of Patent: Oct. 8, 2024

(54) PEDESTALS FOR MODULATING FILM PROPERTIES IN ATOMIC LAYER DEPOSITION (ALD) SUBSTRATE PROCESSING CHAMBERS

(71) Applicant: LAM RESEARCH CORPORATION, Fremont, CA (US)

(72) Inventors: Adrien Lavoie, Newberg, OR (US); Michael Philip Roberts, Tigard, OR (US); Chloe Baldasseroni, Portland, OR (US); Richard Phillips, Newberg, OR (US); Ramesh Chandrasekharan, Lake Oswego, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 493 days.

(21) Appl. No.: 17/426,472

(22) PCT Filed: Jan. 30, 2020

(86) PCT No.: PCT/US2020/015843
§ 371 (c)(1),
(2) Date: Jul. 28, 2021

(87) PCT Pub. No.: WO2020/163147
PCT Pub. Date: Aug. 13, 2020

(65) Prior Publication Data
US 2022/0162749 A1    May 26, 2022

Related U.S. Application Data

(60) Provisional application No. 62/802,904, filed on Feb. 8, 2019.

(51) Int. Cl.
*C23C 16/455* (2006.01)
*C23C 16/458* (2006.01)

(52) U.S. Cl.
CPC .. *C23C 16/45525* (2013.01); *C23C 16/45544* (2013.01); *C23C 16/45565* (2013.01); *C23C 16/458* (2013.01)

(58) Field of Classification Search
CPC .......... C23C 16/45536; C23C 16/4585; C23C 16/45525; C23C 16/458
See application file for complete search history.

(56) References Cited

U.S. PATENT DOCUMENTS 6,106,630 A    8/2000 Frankel
6,475,336 B1 *  11/2002 Hubacek ............. C23C 16/4586
                                                    156/345.47

(Continued)

FOREIGN PATENT DOCUMENTS

KR    20150087974 A    7/2015
TW      201044494 A   12/2010

(Continued)

OTHER PUBLICATIONS

Kwon, KR20150087974, Jul. 2015, English machine translation (Year: 2015).*

(Continued)

*Primary Examiner* — Joseph A Miller, Jr.

(57) ABSTRACT

A system to deposit a film on a substrate using atomic layer deposition includes a pedestal arranged in a processing chamber to support the substrate on a top surface of the pedestal when depositing the film on the substrate. A first annular recess in the pedestal extends downwardly from the top surface of the pedestal and radially inwardly from an outer edge of the pedestal towards an outer edge of the substrate. The first annular recess has an inner diameter that is greater than a diameter of the substrate. An annular ring is made of a dielectric material and is arranged around the substrate in the first annular recess. A second annular recess in the pedestal is located under the annular ring. The second (Continued)

annular recess has a height and extends radially inwardly from the outer edge of the pedestal towards the outer edge of the substrate.

13 Claims, 6 Drawing Sheets

(56) References Cited

U.S. PATENT DOCUMENTS

| | | |
|---|---|---|
| 2016/0201219 A1 | 7/2016 | Corea et al. |
| 2018/0122685 A1 | 5/2018 | Breiling et al. |
| 2018/0251893 A1 | 9/2018 | Hohn et al. |

FOREIGN PATENT DOCUMENTS

| | | |
|---|---|---|
| TW | 201833974 A | 9/2018 |
| TW | 201842226 A | 12/2018 |
| WO | WO2018071598 A1 | 4/2018 |

OTHER PUBLICATIONS

Taiwanese Office Action for Taiwanese Application No. 109103310 dated Sep. 4, 2023.
International Search Report and Written Opinion of the ISA issued in PCT/US2020/015843, mailed May 28, 2020; ISA/KR.

* cited by examiner

PEDESTALS FOR MODULATING FILM PROPERTIES IN ATOMIC LAYER DEPOSITION (ALD) SUBSTRATE PROCESSING CHAMBERS

CROSS-REFERENCE TO RELATED APPLICATIONS

This application is a U.S. National Phase Application under 35 U.S.C. 371 of International Application No. PCT/US2020/015843, filed on Jan. 30, 2020, which claims the benefit of U.S. Provisional Application No. 62/802,904 filed on Feb. 8, 2019. The entire disclosures of the applications referenced above are incorporated herein by reference.

FIELD

The present disclosure relates generally to substrate processing systems and more particularly to pedestals for atomic layer deposition (ALD) substrate processing chambers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform substrate treatment such as deposition or etching of film on a substrate such as a semiconductor wafer. Substrate processing systems typically include a processing chamber with a substrate support (such as a pedestal, a plate, etc.) arranged therein. The substrate is arranged on the substrate support during treatment. A gas diffusion device such as a showerhead may be arranged in the processing chamber to deliver and disperse process gases and purge gases as needed.

In some applications, a film is deposited using plasma-enhanced chemical vapor deposition (PECVD) or plasma-enhanced atomic layer deposition (PEALD). During PEALD, one or more cycles are performed to deposit a film on the substrate. Each PEALD cycle typically includes precursor dosing, dose purging, RF plasma dosing, and RF purging steps. During deposition, process gas may be delivered to the processing chamber using the showerhead. During RF plasma dosing, RF power is supplied to the showerhead, and the substrate support is grounded (or vice versa).

SUMMARY

A system for depositing a film on a substrate using atomic layer deposition in a processing chamber comprises a pedestal arranged in the processing chamber to support the substrate on a top surface of the pedestal when depositing the film on the substrate using atomic layer deposition in the processing chamber. A first annular recess in the pedestal extends downwardly from the top surface of the pedestal and radially inwardly from an outer edge of the pedestal towards an outer edge of the substrate. The first annular recess has an inner diameter that is greater than a diameter of the substrate. An annular ring made of a dielectric material is arranged around the substrate in the first annular recess. A second annular recess in the pedestal is located under the annular ring. The second annular recess has a predetermined height and extends radially inwardly from the outer edge of the pedestal towards the outer edge of the substrate.

In other features, the pedestal is made of a metal. The top surface of the pedestal is coated with a layer of a ceramic material. The layer has a central region and an annular outer region. A thickness of the central region is less than the annular outer region.

In other features, the pedestal is made of a metal. An annular portion of the top surface of the pedestal is coated with a layer of a ceramic. A central portion of the top surface of the pedestal located within the annular portion is uncoated.

In other features, the pedestal is made of a metal. The top surface of the pedestal is coated with a layer of a ceramic material that extends up to the inner diameter of the first annular recess. The layer includes a pocket having a depth that is less than a thickness of the layer and having a radius that is less than a radius of the substrate.

In other features, the pedestal is made of a metal. The top surface of the pedestal is coated with a layer of a ceramic material that extends up to the inner diameter of the first annular recess. The layer includes a pocket having a depth that is equal to a thickness of the layer and having a radius less that is than a radius of the substrate.

In other features, a showerhead arranged above the pedestal in the processing chamber. The showerhead receives RF power when depositing the film on the substrate using atomic layer deposition in the processing chamber. The pedestal is grounded.

In other features, a showerhead arranged above the pedestal in the processing chamber. The pedestal receives RF power when depositing the film on the substrate using atomic layer deposition in the processing chamber. The showerhead is grounded.

In still other features, a system for depositing a film on a substrate using atomic layer deposition in a processing chamber comprises a pedestal that is made of a metal and that is arranged in the processing chamber to support the substrate on a top surface of the pedestal when depositing the film on the substrate using atomic layer deposition in the processing chamber. An annular recess in the pedestal extends downwardly from the top surface of the pedestal and radially inwardly from an outer edge of the pedestal towards an outer edge of the substrate. The annular recess has an inner diameter that is greater than a diameter of the substrate. An annular ring made of a dielectric material is arranged around the substrate in the annular recess. A layer of a ceramic material coats an annular outer region of the top surface of the pedestal.

In another feature, the annular outer region of the layer extends up to the inner diameter of the annular recess.

In other features, the layer further includes a central region abutting the annular outer region. A thickness of the central region is less than the annular outer region.

In other features, the layer further includes a central region abutting the annular outer region. The central region is not coated with the ceramic material.

In other features, the layer further includes a central region abutting the annular outer region. The central region includes a pocket having a depth that is less than a thickness of the layer and having a radius that is less than a radius of the substrate.

In other features, the layer further includes a central region abutting the annular outer region. The central region includes a pocket having a depth that is equal to a thickness of the layer and having a radius that is less than a radius of the substrate.

In other features, a second annular recess in the pedestal is located under the annular ring. The second annular recess has a predetermined height and extends radially inwardly from the outer edge of the pedestal towards the outer edge of the substrate.

In other features, a showerhead arranged above the pedestal in the processing chamber. The showerhead receives RF power when depositing the film on the substrate using atomic layer deposition in the processing chamber. The pedestal is grounded.

In other features, a showerhead arranged above the pedestal in the processing chamber. The pedestal receives RF power when depositing the film on the substrate using atomic layer deposition in the processing chamber. The showerhead is grounded.

In still other features, a system for depositing a film on a substrate using atomic layer deposition in a processing chamber comprises a showerhead arranged in the processing chamber. The showerhead comprises an internal plenum and gas through holes through which to introduce and distribute process gases into the processing chamber. A pedestal made of a metal is arranged directly below the showerhead in the processing chamber to support the substrate on a top surface of the pedestal when depositing the film on the substrate using atomic layer deposition. The pedestal is smaller than an area of the showerhead including the gas through holes. A layer of a ceramic material coats the top surface of the pedestal. The layer includes an annular outer region and a central region abutting the annular outer region. A pocket is arranged in the central region of the layer. The pocket has a depth that is less than or equal to a thickness of the annular outer region of the layer and has a radius that is less than a radius of the substrate.

In other features, the showerhead receives RF power when depositing the film on the substrate using atomic layer deposition in the processing chamber. The pedestal is grounded.

In other features, the pedestal receives RF power when depositing the film on the substrate using atomic layer deposition in the processing chamber. The showerhead is grounded.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to systems and methods for modulating film etch performance including dry etch rates, downstream wet etch rates, film density, and refractive index. The systems and methods involve modifying a form factor and a geometry of a pedestal at an edge of the pedestal. Specifically, reducing an edge area of the pedestal can increase focusing of plasma on a substrate and improve characteristics of a film deposited on the substrate. In addition, applying a ceramic coating on a top surface of the pedestal (directly below the substrate) can be effective in modulating substrate performance.

Additionally, plasma grounding can be directly proximate to the substrate for maximum realization of film properties including etch rates, density, and refractive index. Specifically, the grounding can be directly below the substrate for powered showerhead/grounded pedestal configuration and directly above the substrate for grounded showerhead/powered pedestal configuration.

The systems and methods can be implemented by designing pedestals having a substrate sized contact area in a portion of the pedestal directly below the substrate with a large undercut (cutout) in a portion of the pedestal outside the substrate sized contact area. The cutout increases impedance outside of a substrate plane. Alternatively or additionally, the systems and methods can be implemented by designing pedestals having a substrate sized pedestal or a smaller pedestal in comparison to the showerhead. These and other features of the pedestal designs according to the present disclosure are described below in detail.

The present disclosure is organized as follows. An example of an atomic layer deposition (ALD) processing chamber is shown and described with reference to FIG. 1. A pedestal design with a top portion of the pedestal adjacent to the substrate recessing radially inwardly from the edge of the pedestal is shown and described with reference to FIGS. 2A and 2B. A pedestal design with a ceramic coating applied on a top surface of the pedestal is shown and described with reference to FIGS. 3A-3C. Various additional pedestal designs including combinations of the recessing and coating features are shown and described with reference to FIGS. 4A-4D. An additional pedestal design is shown in FIG. 5 where the pedestal is smaller than an active area of a showerhead (i.e., area including gas through holes), which is an alternative to having the recessing feature shown in FIGS. 2A and 2B.

Figure 1:
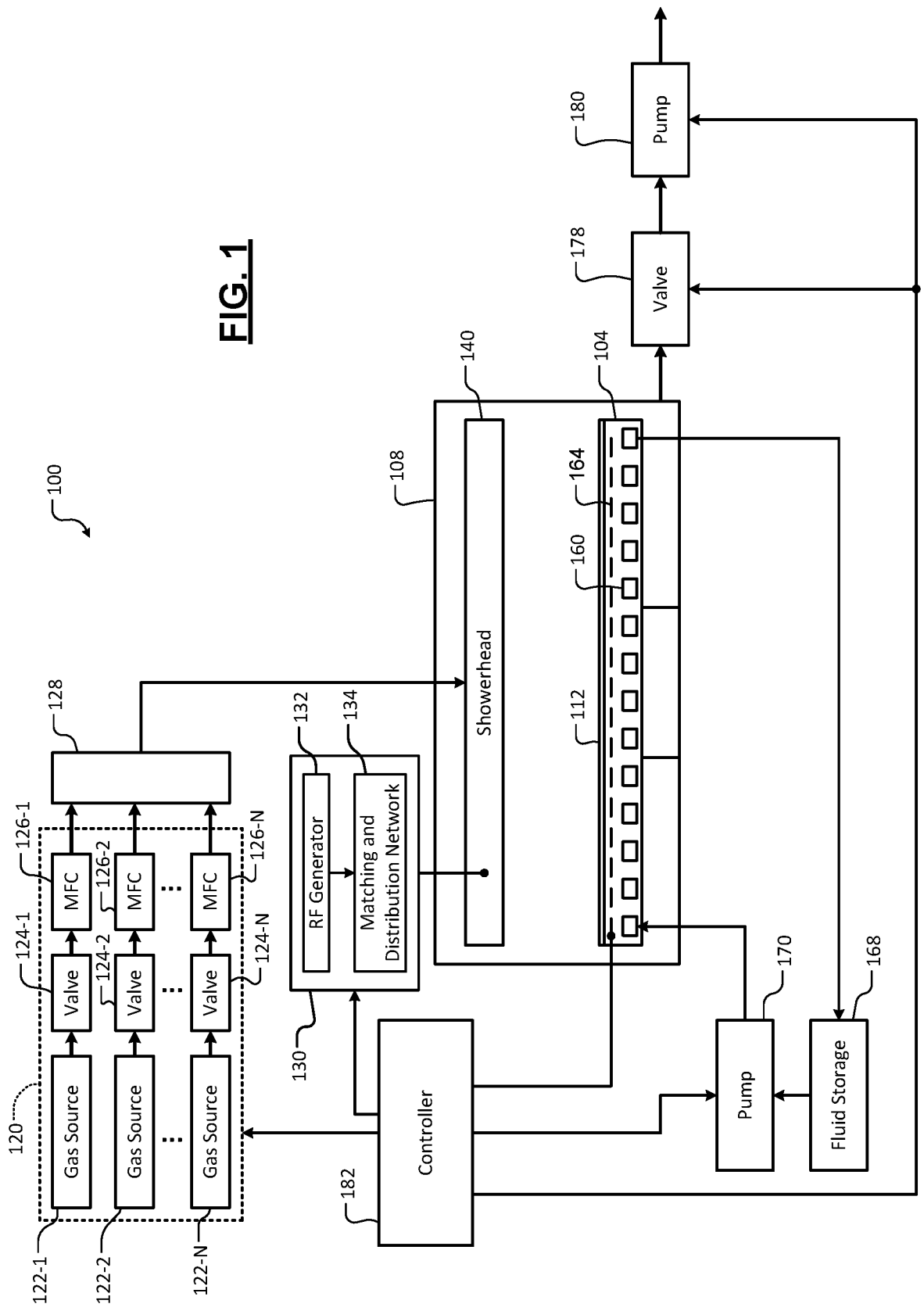
FIG. 1 shows a functional block diagram of an example of a substrate processing system comprising an atomic layer deposition (ALD) processing chamber.

FIG. 1 shows an example of a substrate processing system 100 including a substrate support (e.g., a pedestal) 104. The substrate support 104 is arranged within a processing chamber 108. A substrate 112 is arranged on the substrate support 104 during processing. In some examples, the substrate support 104 may be configured to minimize contact with the substrate 112. For example, only an outer edge of the substrate 112 may contact an upper surface of the substrate support 104; the substrate 112 may be arranged on minimum contact area (MCA) features; etc. While one configuration of the substrate support 104 is shown and described for example only, the teachings of the present disclosure can be applied to many other substrate supports having different configurations.

A gas delivery system 120 includes gas sources 122-1, 122-2, ..., and 122-N (collectively gas sources 122) that are connected to valves 124-1, 124-2, ..., and 124-N (collectively valves 124) and mass flow controllers 126-1, 126-2, ..., and 126-N (collectively MFCs 126). The MFCs 126 control flow of gases from the gas sources 122 to a manifold 128 where the gases mix. An output of the manifold 128 is supplied to a showerhead 140. The showerhead 140 includes an internal plenum and gas through holes. The showerhead 140 introduces and distributes process gases via the gas through holes into the processing chamber 108.

An RF generating system 130 generates and outputs an RF voltage to the showerhead 140 or the substrate support 104 (the other is DC grounded, AC grounded or floating). For example only, the RF generating system 130 may include an RF voltage generator 132 that generates the RF voltage that is fed by a matching network 134 to the showerhead 140 or the substrate support 104. Plasma is generated when process gases and RF power are supplied to the showerhead 140.

In some examples, during each ALD cycle, an inert gas such as argon (Ar) or molecular nitrogen ($N_2$) may be used as primary purge gas flowing through the showerhead 140 in the dose purging and RF purging steps. In addition, molecular oxygen ($O_2$) or molecular nitrogen ($N_2$) may be continuously flowing through the backside of the showerhead 140 as secondary purge in all ALD steps to prevent any undesirable deposition at remote areas such as backside of the showerhead 140, and the walls and top plate of the processing chamber 108.

In some examples, the substrate support 104 may include coolant channels 160. A cooling fluid is supplied to the coolant channels 160 from a fluid storage 168 and a pump 170. In some examples, the substrate support 104 may include a vented seal band (VSB) pedestal. In some examples, the substrate support 104 may include a plurality of zones (not shown). A temperature of the substrate support 104 may be controlled by using independently-controllable heaters 164 optionally arranged in respective zones. When used, the heaters 164 may include resistive or thin film heaters. A valve 178 and a pump 180 may be used to evacuate reactants from the processing chamber 108 and/or to control pressure in the processing chamber 108.

A controller 182 controls the flow of process gases, monitoring process parameters such as temperature, pressure, power, etc., striking and extinguishing plasma, removal of reactants, etc. The controller 182 controls gas delivery from the gas delivery system 120 to supply process and/or purge gases at fixed intervals during a process. The controller 182 controls pressure in the processing chamber 108 and/or evacuation of reactants using the valve 178 and the pump 180. The controller 182 controls the temperature of the substrate support 104 and the substrate 112 based on temperature feedback from sensors (not shown) in the substrate support 104 and/or sensors (not shown) measuring coolant temperature.

Film properties, particularly etch rates, can be significantly improved by modifying the pedestal design in various ways as follows. Specifically, the modifications in the pedestal design described below, individually and in combination, improve focusing of the plasma on the substrate, which in turn improves film characteristics (e.g., etch rates).

Figure 2A:
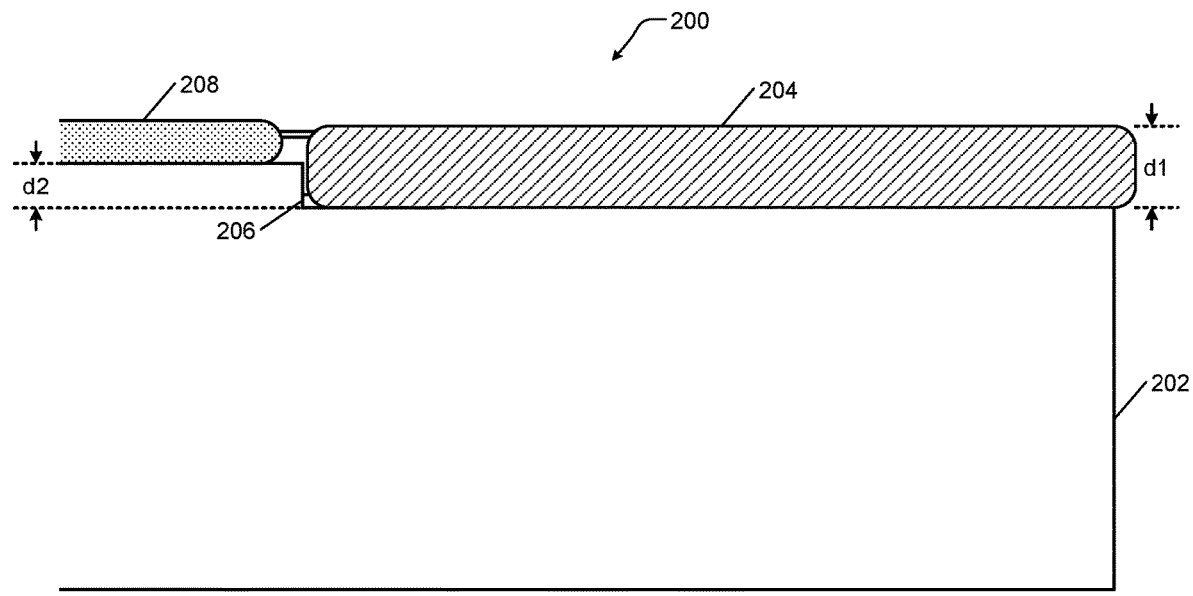
FIGS. 2A and 2B show a pedestal with a recessed (cutout) top portion to improve film characteristics of substrates processed in the ALD processing chamber.

FIG. 2A shows a pedestal design 200 comprising a pedestal 202 and a focus ring 204. The pedestal 202 is made of a metal such as aluminum. The focus ring 204 is made of a dielectric material. The pedestal 202 can include any pedestal mentioned above in the description of FIG. 1. In some examples, the pedestal 202 and other pedestals described below may include a plurality of horizontally stacked pieces of metal (e.g., aluminum). The pieces may have different shapes and may be brazed together to form the pedestal. Only a portion of a top piece of each pedestal is shown in FIGS. 2A-5 to emphasize the details of the various pedestal designs. The top piece has a flat upper surface on which a substrate 208 is arranged during processing.

The pedestal 202 includes an annular recess 206 around a radially outer edge of the pedestal 202. An inner diameter of the annular recess 206 is greater than a diameter of the substrate 208. The focus ring 204 is arranged on the annular recess 206. The focus ring 204 is also annular in shape and has a height (or thickness) d1 that is greater than a height d2 of the annular recess 206. A top surface of the focus ring 204 is arranged in a plane that is parallel to a top surface of a substrate 208 arranged on the non-recessed portion of the pedestal 202. The top surface of the focus ring 204 may be above or below the top surface of the substrate 208.

The focus ring 204 modifies an ionization rate and electron density adjacent to an edge of the substrate 208. The focus ring 204 reduces unwanted plasma discontinuities in this area. The focus ring 204 physically constrains movement of the substrate 208 on the pedestal 202. The focus ring 204 reduces plasmoids that may occur at an edge of the substrate 208 when using some gas species. The proximity of the focus ring 204 at an outer diameter of the substrate 208 can reduce electron density and ionization rates near the edge of the substrate 208.

Figure 2B:
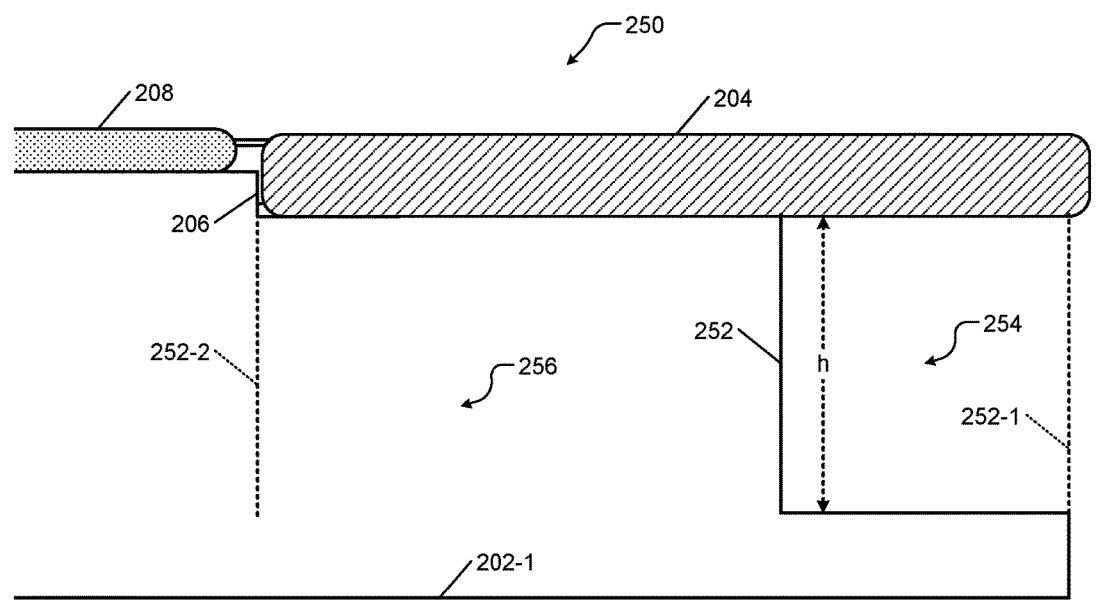

FIG. 2B shows a pedestal design 250 where a portion of the pedestal 202 directly and immediately below the focus ring 204 is recessed radially inwardly. For example, material (e.g., metal such as aluminum) may be removed from the pedestal 202 to form a pedestal 202-1. The pedestal 202-1 defines a recess 252 directly and immediately under the focus ring 204. The height h of the recess 252 is greater than the heights of the focus ring 204 and the annular recess 206.

In some implementations, the recess 252 can extend radially inwardly to any point between a first vertical axis 252-1 along an outer diameter of the focus ring 204 (or an outer edge of the pedestal 202) and a second vertical axis 252-2 along the annular recess 206. The first and second vertical axes 252-1, 252-2 are perpendicular to a plane in which the substrate 208 lies or rests on the non-recessed top portion of the pedestal 202-1.

In some implementations, the recess 252 can extend further towards a center of the pedestal 202-1 under the substrate 208. The extent of the recess 252 can be varied widely since the focus ring 204 is supported by other structures not shown here. Further, as shown and described with reference to FIG. 5, instead of creating the recess 252, the recess 252 can be eliminated altogether and a pedestal that is smaller in size than the showerhead may be used instead.

A region 254 of the pedestal 202-1 where the material is removed from the pedestal 202-1 offers a greater electrical impedance than a portion 256 of the pedestal 202-1 where the material (metal) is not removed from the pedestal 202-1. Accordingly, the recess 252 changes the characteristics of the film deposited on the substrate 208. Specifically, the recess 252 improves the focusing of the plasma on the substrate 208, which in turn improves film characteristics (e.g., etch rates). The height h and the extent of the recess 252 between the first and second vertical axes 252-1, 252-2

(or radially further inward from the second vertical axis 252-2) can be selected based on the process to be performed on the substrate 208 and factors including the design of the showerhead, and so on.

Figure 3A:
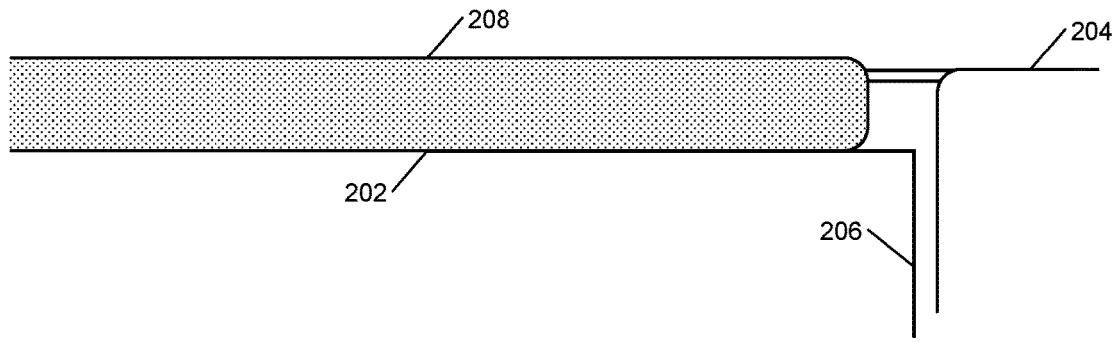
FIGS. 3A-3C show a pedestal with a ceramic coating applied on a top surface of the pedestal to improve film characteristics of substrates processed in the ALD processing chamber.
Figure 3B:
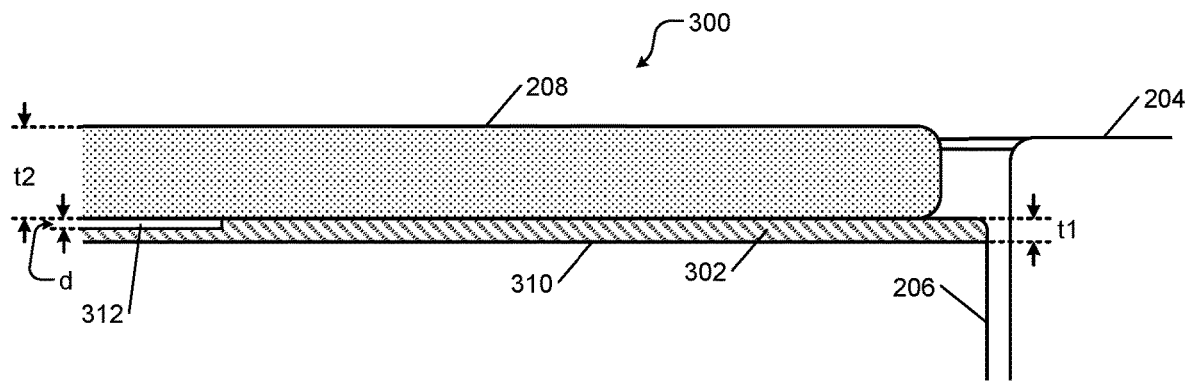
Figure 3C:
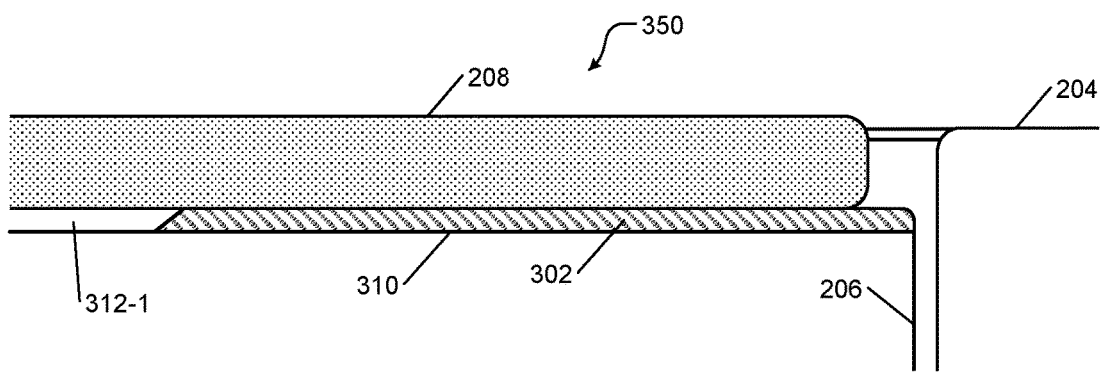

FIGS. 3A-3C show additional pedestal designs where a coating or a layer of a dielectric material such as a ceramic material is disposed on a top surface of the pedestal (i.e., on the top metal surface of the pedestal). FIG. 3A shows a portion of the pedestal design 200 shown in FIG. 2A to emphasize a portion of the pedestal 202 where the dielectric coating is applied. FIG. 3B shows a first pedestal design 300 with the dielectric coating. FIG. 3C shows a second pedestal design 350 with the dielectric coating.

FIG. 3B shows the first pedestal design 300 in which a dielectric coating 302 is applied directly on a top surface 310 of the pedestal 202. The substrate 208 rests directly on top of the dielectric coating 302. In other words, there are no intervening layers of any material between the dielectric coating 302 and the top surface 310 of the pedestal 202, and there are no intervening layers of any material between the substrate 208 and the dielectric coating 302. This is true for all of the pedestal designs shown in FIGS. 3B-5.

The dielectric coating 302 extends radially from a center of the top surface 310 of the pedestal 202 to the annular recess 206. A thickness t1 of the dielectric coating 302 is less than a thickness t2 of the substrate 208. In general, the thickness t1 of the dielectric coating 302 may be less than or equal to about one hundredth of one inch. For example, the thickness t1 of the dielectric coating 302 is about four to eight thousandths of one inch.

In a portion of the dielectric coating 302 that is near the center of the top surface 310 of the pedestal 202, a circular pocket 312 having a diameter D and depth d is formed. The depth d of the pocket 312 is less than the thickness t1 of the dielectric coating 302. The diameter D of the pocket 312 is less than the diameter of the substrate 208. The circular pocket 312 denotes an annular trench or an annular recess and may also be called the circular trench 312 or the circular recess 312.

The dielectric coating 302 and the pocket 312 change the characteristics of the film deposited on the substrate 208. Specifically, the dielectric coating 302 and the pocket 312 improve the focusing of the plasma on the substrate 208, which in turn improves film characteristics (e.g., etch rates). The diameter and the depth of the pocket 312 can be selected based on the process to be performed on the substrate 208 and factors including the design of the showerhead, and so on.

FIG. 3C shows the second pedestal design 350 in which a circular pocket 312-1 extends downward through the dielectric coating 302 all the way to the top surface 310 of the pedestal 202. In other words, while the diameter of the pocket 312-1 is less than the diameter of the substrate 208 similar to the pocket 312, the depth d of the pocket 312-1 is equal to the thickness t1 of the dielectric coating 302 unlike the pocket 312.

Accordingly, in a top view of the pedestal 220, the top surface 310 of the pedestal 202 is visible in the absence of the substrate 208. Again, the circular pocket 312-1 denotes an annular trench or an annular recess and may also be called the circular trench 312-1 or the circular recess 312-1. The dielectric coating 302 and the pocket 312-1 change the characteristics of the film deposited on the substrate 208. Specifically, the dielectric coating 302 and the pocket 312-1 improve the focusing of the plasma on the substrate 208, which improves film characteristics (e.g., etch rates).

Stated differently, the ceramic layer may be described as having an annular outer portion and a central portion abutting the annular outer portion. The central region has a thickness less than that of the annular outer portion as shown in FIG. 3B. Alternatively, the central region has no coating at all as shown in FIG. 3C.

Figure 4A:
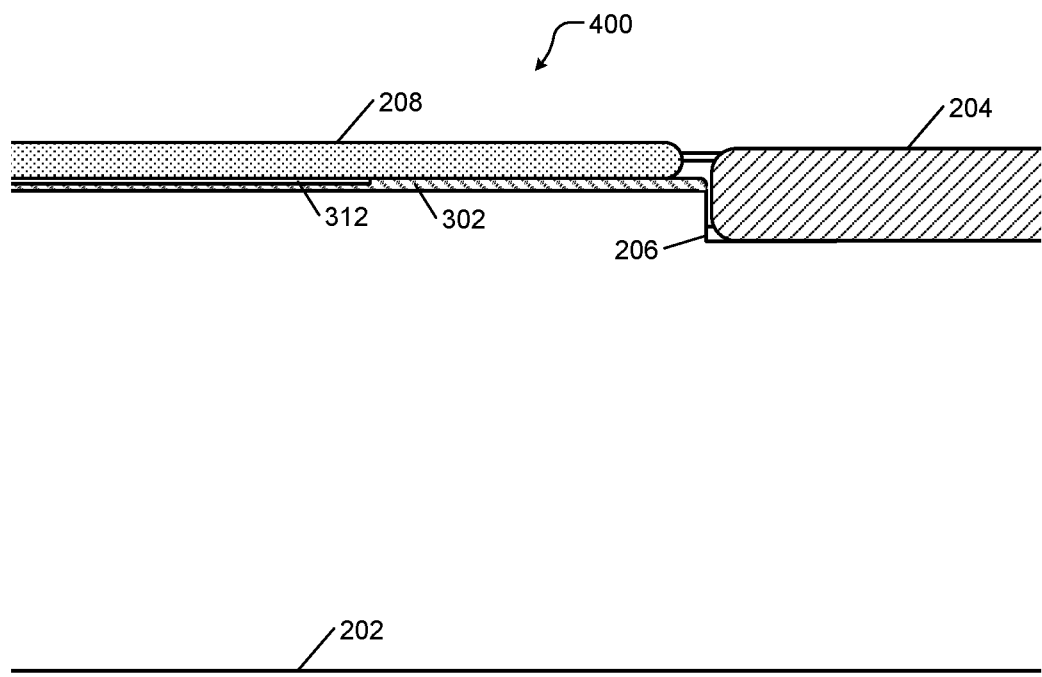
FIGS. 4A-4D show various pedestal designs including combinations of the recessing and coating features shown in FIGS. 2A-3C to further improve film characteristics of substrates processed in the ALD processing chamber.
Figure 4B:
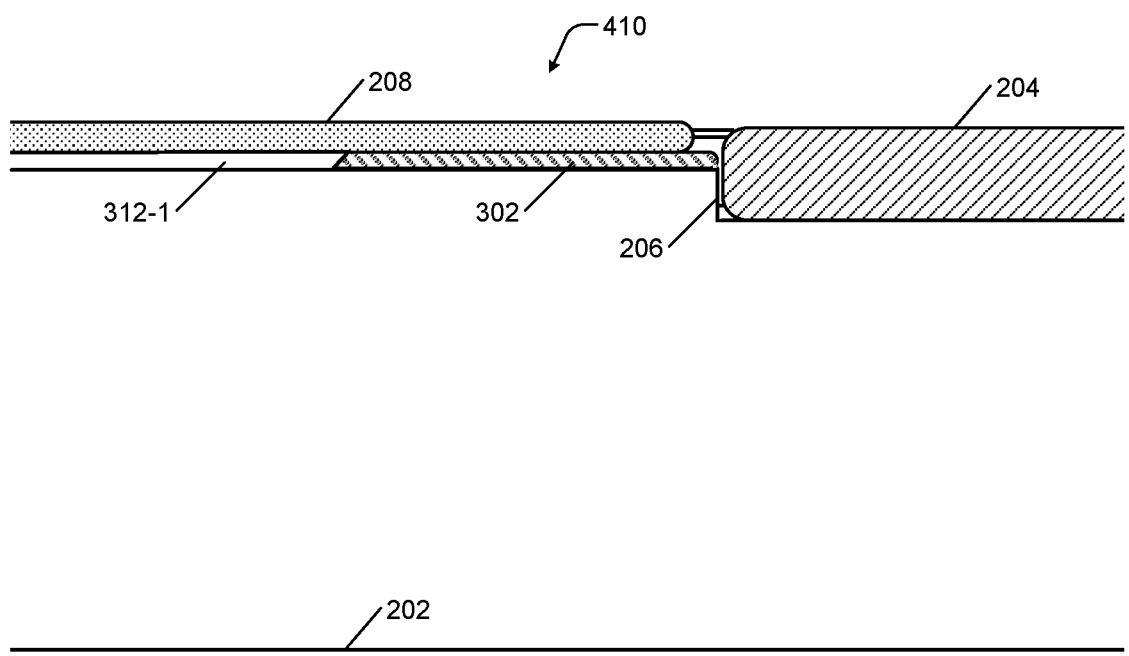
Figure 4C:
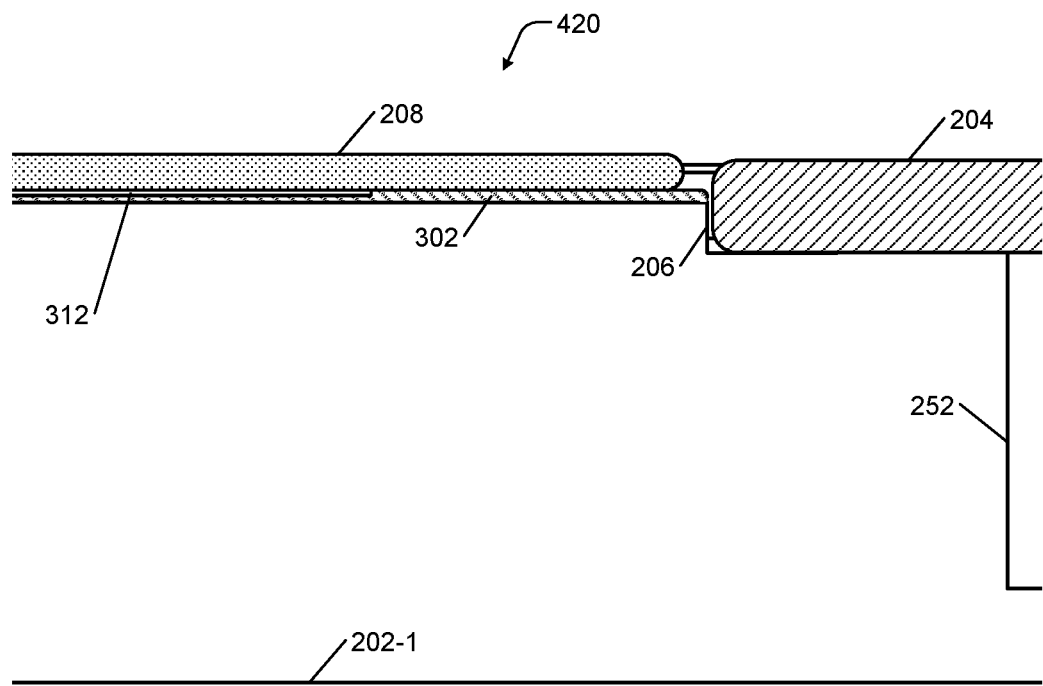
Figure 4D:
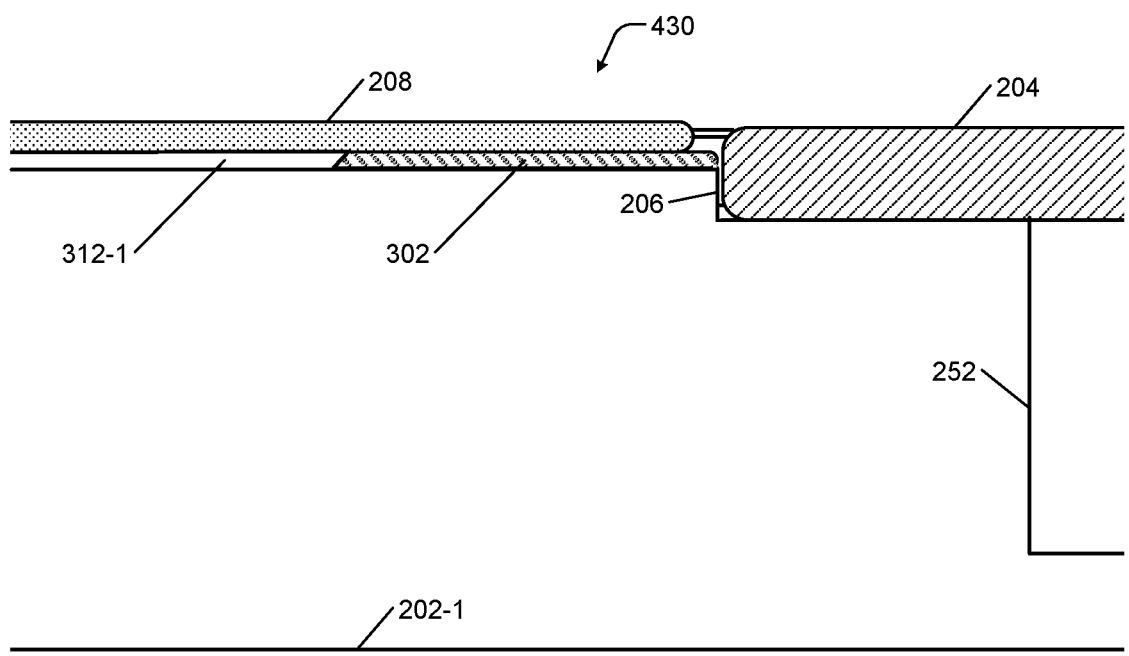
Figure 5:
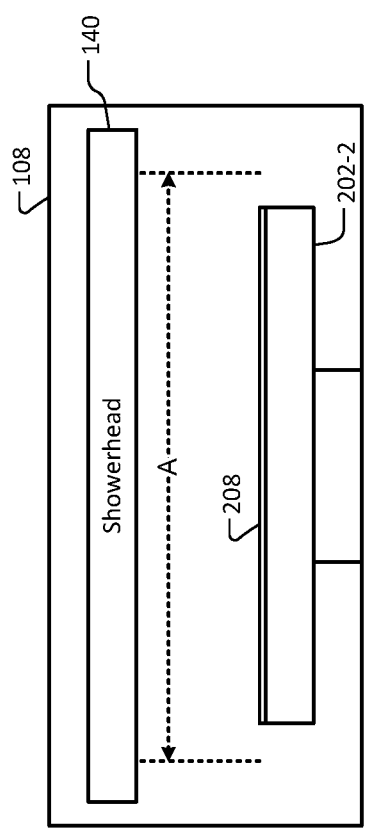
FIG. 5 shows a pedestal design where the pedestal is smaller in size than an active area of a showerhead.

FIGS. 4A-4D show additional pedestal designs that combine the pedestal designs shown in FIGS. 2A-2B and the pedestal designs shown in FIGS. 3B-3C. Specifically, FIGS. 4A and 4B show the pedestal design 200 shown in FIG. 2A combined with the dielectric coating and pockets shown in FIGS. 3B and 3C. FIGS. 4C and 4D show the pedestal design 250 shown in FIG. 2B combined with the dielectric coating and pockets shown in FIGS. 3B and 3C. The combined designs shown in FIGS. 4A-4D further improve the film characteristics. Only portions of the pedestal designs are shown to illustrate the features that are being combined.

FIG. 4A shows a pedestal design 400 comprising the pedestal 202, the focus ring 204, and the annular recess 206 shown in FIG. 2A. In addition, the pedestal 202 includes the dielectric coating 302 and the pocket 312 shown in FIG. 3B. The pedestal 202 does not include the recess 252 shown in FIG. 2B. The dielectric coating 302 and the pocket 312 change the characteristics of the film deposited on the substrate 208. Specifically, the dielectric coating 302 and the pocket 312 improve the focusing of the plasma on the substrate 208, which improves film characteristics (e.g., etch rates).

FIG. 4B shows a pedestal design 410 comprising the pedestal 202, the focus ring 204, and the annular recess 206 shown in FIG. 2A. In addition, the pedestal 202 includes the dielectric coating 302 and the pocket 312-1 shown in FIG. 3C. The pedestal 202 does not include the recess 252 shown in FIG. 2B. The dielectric coating 302 and the pocket 312-1 change the characteristics of the film deposited on the substrate 208. Specifically, the dielectric coating 302 and the pocket 312-1 improve the focusing of the plasma on the substrate 208, which improves film characteristics (e.g., etch rates).

FIG. 4C shows a pedestal design 420 comprising the pedestal 202-1, the focus ring 204, the annular recess 206, and the recess 252 shown in FIG. 2B. In addition, the pedestal 202-1 includes the dielectric coating 302 and the pocket 312 shown in FIG. 3B. The recess 252, the dielectric coating 302, and the pocket 312 change the characteristics of the film deposited on the substrate 208. Specifically, the recess 252, the dielectric coating 302, and the pocket 312 improve the focusing of the plasma on the substrate 208, which in turn improves film characteristics (e.g., etch rates).

FIG. 4D shows a pedestal design 430 comprising the pedestal 202-1, the focus ring 204, the annular recess 206, and the recess 252 shown in FIG. 2B. In addition, the pedestal 202-1 includes the dielectric coating 302 and the pocket 312-1 as shown in FIG. 3C. The recess 252, the dielectric coating 302, and the pocket 312-1 change the characteristics of the film deposited on the substrate 208. Specifically, the recess 252, the dielectric coating 302, and the pocket 312-1 improve the focusing of the plasma on the substrate 208, which in turn improves film characteristics (e.g., etch rates).

In some implementations, instead of providing the recess 252 in the pedestal, a pedestal that is smaller in size than the active area of the showerhead may be used, which makes creating the recess 252 in the pedestal unnecessary. This is schematically shown in FIG. 5. The active area of the showerhead 140 is an inner area A within which the gas through holes are located. A smaller size of a pedestal 202-2 relative to the active area A of the showerhead 140 improves the focusing of the plasma on the substrate 112, which in turn improves film characteristics (e.g., etch rates).

Additionally, while not shown, the dielectric coating 302 and the pockets 312/312-1 can be provided on the pedestal 202-2 as shown in FIGS. 3B and 3C. The smaller size of the pedestal 202-2 in combination with the dielectric coating 302 and the pockets 312/312-1 on the pedestal 202-2 improves the focusing of the plasma on the substrate 112, which in turn improves film characteristics (e.g., etch rates).

In the pedestal designs described above, grounding can be provided in an area directly proximate to the substrate for maximum realization of desired film properties and etch rates. For example, when the showerhead is powered and the pedestal is grounded, grounding is provided in the pedestal via one or more electrical contacts located directly and immediately below the substrate. The number of grounding contacts in the pedestal may vary. When the pedestal is powered, and the showerhead is grounded, grounding is provided in the showerhead via one or more electrical contacts located directly and immediately above the substrate. The number of grounding contacts in the showerhead may vary.

Any of the pedestal designs described above with reference to FIGS. 2A-5 can be used in the processing chamber 108 shown in FIG. 1. The pedestal designs increase the focusing of the plasma on the substrate and significantly improve film characteristics and reduce film etch rates.

Notably, the ceramic coating 302 on which the substrate rests is vastly different than, and therefore incomparable to, a ceramic plate typically used to support substrates in many pedestals. For example, in many pedestals, the ceramic plate is arranged on a metal base plate, where the ceramic plate and the metal base plate form the pedestal. There are significant structural and functional differences between the ceramic coating 302 and the typical ceramic plate.

Specifically, the ceramic coating 302 is only about four to eight thousandths of an inch thick while the ceramic plate is many millimeters thick. Further, while the ceramic plate is bonded to the metal base plate using a layer of bonding material, the ceramic coating 302 is not bonded to the metal; instead, the ceramic coating 302 is sprayed on the top surface of the metal.

More importantly, the typical ceramic plate comprises many components while the ceramic coating 302 comprises none. For example, the typical ceramic plate comprises one or more heaters to heat the substrate in some designs. In contrast, the ceramic coating 302 does not include any heaters. The typical ceramic plate comprises a clamping electrode and a de-clamping electrode in some designs. In contrast, the ceramic coating 302 does not include any electrode. Further, while DC and RF biases may be supplied to the components in the typical ceramic plate, no bias is supplied to the ceramic coating 302. Thus, the ceramic coating 302 is vastly different than, and incomparable to, the ceramic plate used in many pedestals.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each embodiment is described as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system to deposit a film on a substrate using atomic layer deposition in a processing chamber, the system comprising:
    a pedestal that is made of a metal or ceramic and that is arranged in the processing chamber to support the substrate on a top surface of the pedestal when depositing the film on the substrate using atomic layer deposition in the processing chamber;
    an annular recess in the pedestal that extends downwardly from the top surface of the pedestal and radially inwardly from an outer edge of the pedestal towards an outer edge of the substrate, wherein the annular recess has an inner diameter that is greater than a diameter of the substrate;
    an annular ring that is made of a dielectric material and that is arranged around the substrate in the annular recess;
    a layer of a ceramic material that coats an annular outer region of the top surface of the pedestal; and
    a second annular recess in the pedestal that is located under the annular ring, wherein the second annular recess has a height and extends radially inwardly from the outer edge of the pedestal towards the outer edge of the substrate.

2. The system of claim 1 wherein the annular outer region of the layer extends up to the inner diameter of the annular recess.

3. The system of claim 1 wherein the layer further includes a central region abutting the annular outer region and wherein a thickness of the central region is less than the annular outer region.

4. The system of claim 1 wherein the layer further includes a central region abutting the annular outer region and wherein the central region is not coated with the ceramic material.

5. The system of claim 1 wherein:
    the layer further includes a central region abutting the annular outer region; and
    the central region includes a pocket having a depth that is less than a thickness of the layer and having a radius that is less than a radius of the substrate.

6. The system of claim 1 wherein:
    the layer further includes a central region abutting the annular outer region; and
    the central region includes a pocket having a depth that is equal to a thickness of the layer and having a radius that is less than a radius of the substrate.

7. The system of claim 1 further comprising:
    a showerhead arranged above the pedestal in the processing chamber;
    wherein the showerhead receives radio frequency power when depositing the film on the substrate using atomic layer deposition in the processing chamber; and
    wherein the pedestal is grounded.

8. The system of claim 1 further comprising:
    a showerhead arranged above the pedestal in the processing chamber;
    wherein the pedestal receives radio frequency power when depositing the film on the substrate using atomic layer deposition in the processing chamber; and
    wherein the showerhead is grounded.

9. A system to deposit a film on a substrate using atomic layer deposition in a processing chamber, the system comprising:
    a showerhead arranged in the processing chamber, the showerhead comprising an internal plenum and gas through holes through which to introduce and distribute process gases into the processing chamber;
    a pedestal that is made of a metal and that is arranged directly below the showerhead in the processing chamber to support the substrate on a top surface of the pedestal when depositing the film on the substrate using atomic layer deposition, wherein the pedestal is smaller than an area of the showerhead including the gas through holes;

a layer of a ceramic material that coats the top surface of the pedestal, wherein the layer includes an annular outer region and a central region abutting the annular outer region; and a pocket arranged in the central region of the layer, wherein the pocket has a depth that is less than or equal to a thickness of the annular outer region of the layer and has a radius that is less than a radius of the substrate.

10. The system of claim 9 wherein:

the showerhead receives radio frequency power when depositing the film on the substrate using atomic layer deposition in the processing chamber; and the pedestal is grounded.

11. The system of claim 9 wherein:

the pedestal receives radio frequency power when depositing the film on the substrate using atomic layer deposition in the processing chamber; and the showerhead is grounded.

12. A pedestal to support a semiconductor substrate on a top surface of the pedestal, the pedestal comprising:

an annular recess in the pedestal that extends downwardly from the top surface of the pedestal and radially inwardly from an outer edge of the pedestal towards an outer edge of the semiconductor substrate, wherein the annular recess has an inner diameter that is greater than a diameter of the semiconductor substrate;

an annular ring that is made of a dielectric material and that is arranged around the semiconductor substrate in the annular recess;

a layer of a ceramic material that is disposed on an annular outer region of the top surface of the pedestal and that includes a central region abutting the annular outer region, wherein the central region is not coated with the ceramic material; and a second annular recess in the pedestal that is located under the annular ring, wherein the second annular recess has a height and extends radially inwardly from the outer edge of the pedestal towards the outer edge of the semiconductor substrate.

13. The pedestal of claim 12 wherein the annular outer region of the layer extends up to the inner diameter of the annular recess.

* * * * *